(12) United States Patent
Schulz

(10) Patent No.: US 6,187,718 B1
(45) Date of Patent: Feb. 13, 2001

(54) CARBON COMPOSITE SUPERCONDUCTORS

(75) Inventor: David A. Schulz, Flowery Branch, GA (US)

(73) Assignee: BP Amoco Corporation, Chicago, IL (US)

(*) Notice: Under 35 U.S.C. 154(b), the term of this patent shall be extended for 0 days.

(21) Appl. No.: 08/305,588

(22) Filed: Sep. 14, 1994

(51) Int. Cl.$^7$ ....................................... H01B 12/00
(52) U.S. Cl. .................. 505/232; 505/230; 505/233; 505/236; 505/704; 174/125.1
(58) Field of Search ................... 505/230, 232, 505/233, 236, 704; 427/62; 174/125.1; 428/930

(56) References Cited

U.S. PATENT DOCUMENTS 4,845,308 * 7/1989 Womack, Jr. et al. ............. 174/15.4
4,975,413 * 12/1990 Satek et al. ............................. 505/1

FOREIGN PATENT DOCUMENTS 63-244524 * 10/1988 (JP).

* cited by examiner

Primary Examiner—Roy V. King
(74) Attorney, Agent, or Firm—Richard J. Schlott; Jennifer M. Hall; Stephen L. Hensley

(57) ABSTRACT

Superconducting composites comprising a high thermal conductivity carbon substrate and a layer of ceramic-type superconductor. Particularly attractive for use as a superconducting flexible conductor are composites comprising a high thermal conductivity, low resistivity carbon fiber disposed within a non-adherent sleeve layer formed of the superconducting ceramic material.

5 Claims, 1 Drawing Sheet

CARBON COMPOSITE SUPERCONDUCTORS

BACKGROUND OF THE INVETION

This invention relates to a superconducting composite, and more particularly to superconducting composites comprising a high strength, ultrahigh modulus, high thermal conductivity carbon substrate and a ceramic-type superconductor layer. In one embodiment, the invention relates to superconducting composites comprised of a high strength, ultrahigh modulus, high thermal conductivity, low electrical resistivity carbon fiber disposed within a sleeve layer formed of ceramic-type superconductor such as a rare earth, Ba, Cu, oxide-type superconductor (1-2-3 superconductor), which composite is capable of achieving significant current densities at high magnetic field strengths under superconducting conditions. The term carbon fiber as used herein includes both a carbon monofilament as well as a bundle of monofilaments (a yarn).

Superconducting ceramic-type materials composed of a combination of rare earth (e.g. yttrium) oxide, barium oxide and copper oxide which have significantly higher superconduction transition temperatures than earlier materials such as Nb/Ti alloys, niobium carbonitride and the like are widely known and well described in the art. Superconduction transition temperatures above 77° K. (the boiling point of liquid nitrogen) are commonly found for these materials, and even higher transition temperatures are considered possible based upon current theories explaining superconducting behavior. The economic advantage that these new superconductors could have over previously existing lower superconducting-transition-temperature superconductors is large enough that many new uses for superconductors now can be devised and present uses enormously improved. However, because these new mixed-oxide superconductors are brittle, ceramic-like materials, they do not lend themselves easily to fabrication in the form of high strength, wire-type geometries, a requirement for many important uses to which superconductors have been put in the past. These uses largely revolve about strong field magnets used in high energy physics, traffic engineering, etc.

One way of fabricating a brittle superconducting material in wire-like form is set forth in an article by K. Brennfleck et al. entitled "Chemical Vapor Deposition of Superconducting Niobium Carbonitride Films on Carbon Fibers", published in Proceedings of the 7th Conference on Chemical Vapor Deposition, Electrochemical Society (1979) at p. 300. This article describes depositing a niobium carbonitride layer directly onto a multifilament carbon yarn by chemical vapor deposition (CVD) to form a superconducting composite. However, the Brennfleck et al. composites employ a low thermal conductivity, more reactive carbon fiber and the structure shown in the photomicrographs accompanying the article exhibits a poor physical structure. Addition al aspects of niobium carbonitride-carbon fiber based superconducting composites are taught in U.S. Pat. Nos. 4,299,861; 4,581, 289; and 4,657,776. Ultrahigh modulus, high thermal conductivity carbon fibers of low resistivity that will perform most, if not all, the stabilization required for carbon fiber superconducting composite operation are disclosed in U.S. Pat. No. 5,266,294. Thus, the need for the outermost copper coating used in the previous literature for stabilization is either reduced or eliminated resulting in simpler and more economical devices.

The usefulness of an intermediate carbide or oxide layer between a carbon fiber and a niobium carbonitride superconductor layer to improve adhesion of the superconductor is taught in U.S. Pat. No. 4,585,696. Such a layer depends upon its intermediate (to the fiber and superconductor) coefficient of expansion to achieve its adhesive effect.

The new mixed-oxide ceramic-type suprconductors are different in physical properties than the Brennfleck et al. niobium carbonitride material and these differences lead to different considerations for fabricating the superconductor into wire-like form. For example, the niobium compound has a cubic crystal structure and its critical current and critical fields are isotropic, i.e., the same along each of its three crystallographic axes. The new 1-2-3 superconductors on the other hand show a much smaller critical current and critical field along the c crystallographic axis than along the a and b crystallographic axes. Thus, it may be important to align the a b planes of the 1-2-3 superconductor microcrystals as completely as possible parallel to the fiber axis for maximum effectiveness when made in a superconducting device.

More recently, in U.S. Pat. No. 4,975,413 there were disclosed superconductive composites comprising a ceramic-type superconductor such as the rare earth, Ba, Cu oxide-type superconductors formed as an adhering layer on a low electrical resistivity, high thermal conductivity, high strength, ultrahigh modulus carbon fiber. The composites are disclosed to be formable into strong, flexible conductors capable of exhibiting substantial critical currents and critical magnetic fields under superconducting conditions. Although these composites are thus quite attractive for superconductive uses, there are substantial differences in coefficient of thermal expansion between the coated superconductors and the carbon substrate. The differential expansion and contraction that results in the various manufacturing steps, and particularly when coating the carbon fiber with the ceramic at an elevated temperature and then cooling the composite, places significant stress on the structure which may lead to cracking and other failure modes. As is further disclosed in the patent, a compressive layer may be included between the coating and the substrate to accommodate these dimensional changes and thereby minimize such failures during the manufacturing operations or avoid them altogether. However, when the composite is repeatedly cycled in use to the very low temperatures necessary for superconduction, the dimensional changes may be quite large, placing stresses on the ceramic coating that are very severe and raider exacerbate the cracking problem. The art thus continues to seek further improvement in the design of composite structures that are intended to withstand thermal cycling to the extremely low temperatures contemplated as the operating environment for superconductive structures.

SUMMARY OF THE INVENTION

The invention described herein is a superconducting composite comprising a low electrical resistivity, highly thermally conductive carbon substrate and a ceramic-type superconductive layer. In a preferred embodiment, the superconductive composite of this invention comprises an ultrahigh modulus, highly thermally conductive carbon fiber and a sleeve layer formed of a superconducting mixed oxide having a transition temperature above 77° K. The mixed oxide employed in the preferred structure may be of formula $A_1B_2Cu_3O_{7-x}$, wherein A is one or more elements selected from the group consisting of yttrium, lanthanum and the lanthanides, B is one or more Group IIA elements, and x is a number between 0 and 1.

Figure 1:
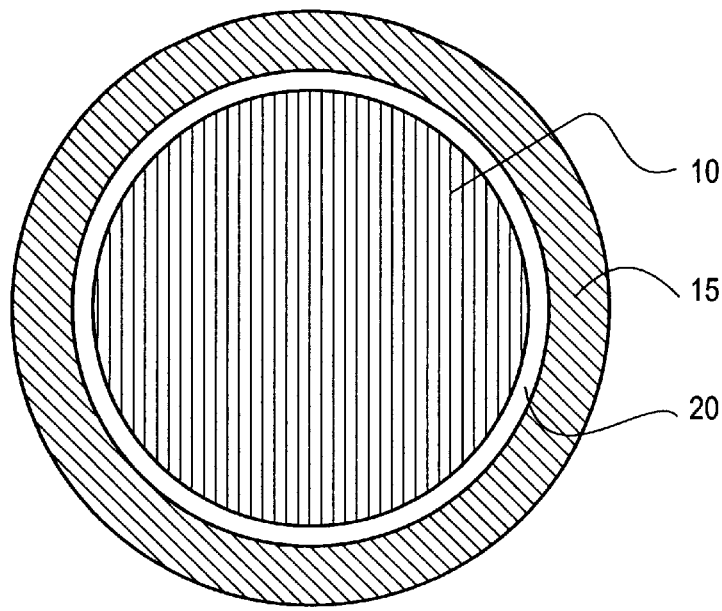
FIG. 1 shows an idealized cross-section view of a composite according to the invention having a carbon fiber disposed within a sleeve layer of ceramic-type superconductor.

It will be understood that the Figures are idealized representations of the particular embodiments as described; the carbon fiber component may have other than a circular cross-section, and may even be axially split, giving a "Pac Man" cross-sectional appearance.

DETAILED DESCRIPTION OF THE INVENTION

Carbon fibers have long been known, and methods for their production from a variety of precursors are well described in the art. Cellulosic precursors have been used for producing carbon fiber since the early 1960's, with rayon being the dominant carbon fiber precursor for nearly two decades. More recently, as the art has developed methods for producing carbon fiber derived from such materials as polyacrylonitrile (PAN) and pitch, the importance of rayon-based carbon fiber has declined. Polyacrylonitrile fiber, when oxidized and carbonized under appropriate conditions, provides tough, high strength, high modulus carbon fiber, and the overall conversion yield in producing fiber from PAN is good. Consequently, PAN fiber has been long preferred for fabricating preform structures.

Carbon fiber may also be readily produced from a mesophase pitch by spinning the molten pitch into fiber, oxidizing the pitch fiber to form a thermoset fiber, and carbonizing by further thermal treatment in the absence of air. As is well known and understood in the art, the melt-spun pitch filaments are highly ordered structures comprising elongated, liquid crystal mesophase domains aligned with the filament axis. On carbonizing, these domains provide carbon or graphitic fiber with a high degree of crystalline order. Such highly ordered pitch-based fiber has generally been recognized as capable of providing carbon fiber having greater stiffness and higher thermal conductivity than carbon fiber from other sources, and a great deal of effort has been expended in attempting to develop carbon composites with a similar combination of properties and a low or even negative coefficient of thermal expansion.

Recently, a line of pitch-based carbon fiber products has been introduced into the art having characteristics approaching those of highly ordered, highly-graphitic carbon, and fiber with thermal conductivity exceeding that of most metals including copper may now be obtained from commercial sources. Methods for producing such fiber have been disclosed and described in the art, for example in U.S. Pat. No. 5,266,294. These ultrahigh modulus, pitch-based, high thermal conductivity carbon fibers, particularly in the form of untwisted carbon fiber yarns, will be preferred in the practice of this invention. While carbon fiber from a variety of sources having lower thermal properties may prove suited for use in particular applications, for most superconductivity uses where thermal properties are of critical importance, these will not be preferred. However, should fibers from PAN or rayon sources be made with thermal properties approaching those made of pitch, such fibers could also find utility in these applications.

As noted, the carbon fiber useful herein has relatively good electrical conductivity characteristics, and hence is a low resistivity fiber. Typically, the lower the resistivity, the better suited the fiber for this invention, and any improvement on their resistivity such as by doping with $SbF_5$ and the like may thus be desirable so long as strength, modulus and thermal conductivity do not particularly suffer. Resistivities of less than about 3 micro-ohm-m are typical for these fibers, but fibers of higher resistivity (less than 20 micro-ohm-m) may be used. Preferred are fibers having a resistivity of less than about 1.5 micro-ohm-m, while fiber with even lower resistivities, as low as 0.7 micro-ohm-m, are known and may be highly desired for such use.

The size of the carbon fiber useful herein is dictated to some extent by the use to which the superconducting composite is to be put, but it should be large enough to avoid easy fiber breakage and not so thick as to preclude the fiber showing the flexibility normally expected of an electrical conductor, if the end result is used for that purpose. Length of the fiber typically depends upon the end use of the composite and the method of making the composite. Generally, the tensile strength of the carbon fiber should be above about 150 kpsi, more preferably above about 300 kpsi, and even more preferably, above about 500 kpsi. Such high strength fibers give composites which, when used to wind superconducting magnets, can help withstand the stress produced by the high fields produced in high magnetic field superconducting magnets.

The low resistivity, pitch-based carbon fiber preferred for use in the practice of this invention has particularly high thermal conductivity. The high thermal conductivity characteristic allows a quick and even distribution of temperature throughout the composite, and the fiber thus will be particularly useful for adiabatic stabilization where the composite is used for high field magnet purposes. For such use, a thermal conductivity at least as great copper (390 watts/m/° C. at 20° C.) is preferred, and a value of at least twice that of copper is more preferred, while a fiber having a thermal conductivity at least three times and even as great as four times that of copper or greater will be highly desirable. Fiber with lower thermal conductivity, from at least about 20 percent as great as copper to a value equal to that of copper may find utility in some specialized superconductivity applications, however such fiber will ordinarily be less preferred.

Carbon fiber suitable for use in the practice of this invention is readily available from commercial sources, and will include the various grades of pitch-based THORNEL carbon fibers available from Amoco Performance Products, Inc. Particularly suitable are the ultrahigh thermal conductivity grades having thermal conductivities greater than 900 watts/m/° C., including K1100 grade pitch-based carbon fiber.

The superconductors useful in the invention described herein are ceramic-type superconductors. They include niobium carbonitride and oxide, the $La_2CuO_4$ materials and the so-called, 1-2-3 superconductors. These latter materials are of general formula $A_1B_2Cu_3O_{7-x}$, where A is one or more elements selected from yttrium, lanthanum or a lanthanide, B is one or more Group IIA metals such as calcium, strontium or barium, etc., and x is in the range 0 and 1. These materials can be made by heating mixtures of, for example, a yttrium compound, a barium compound, a copper (II) compound in the proportions given by the general formula above and annealing in an oxygen-containing or releasing atmosphere. Typical compounds suitable for these uses include $YBa_2Cu_3O_{6.93}$ and the like. These compounds have crystal structures which are based upon the Perovskite structure and superconducting transition temperatures between about 90° and about 98° K., although it is likely that certain members of the family will show higher superconducting transition temperatures. Also, there is some indication that the copper or oxygen portion of these superconductors can be in part or completely replaced by another element, and such compounds are considered within the description of the invention contained herein. More recently, in U.S. Pat. No. 5,157,581, there is described a ceramic material containing copper that is described as exhibiting superconductivity or superconductor-like behavior at temperatures above 200° K., and these ceramic materials may also be found suitable for use in the practice of the invention.

A major difficulty in fabricating superconducting carbon composites lies in the great differences in coefficient of thermal expansion (CTE) of the component materials. In general, at temperatures below about 600° C., the CITE of the carbon substrates employed in the construction of the invented composites will be negative in the axial direction of the fiber and not far from zero in the radial direction. Solid, ceramic-type superconductors generally will have an overall positive CTE. In constructing prior art superconductive composites such as those described in U.S. Pat. No. 4,975,413, the superconductive layer will be adhered to the surface of the carbon fiber. Alternatively, the superconductive layer will be deposited on a compressive layer sandwiched between the two components. The thickness of the compressible layer will be determined by the compressible layer porosity, carbon fiber CTE and superconductor CTE, as may be understood by one skilled in the art During temperature cycling, for example, when the composite is cooled to room temperature after depositing the superconductive ceramic coating in the manufacture of the structure, the compressive layer will serve to absorb the stresses imposed by contraction of the superconductive layer, thereby preventing cracking. However, and particularly where the composite superconductor will be further cooled to temperatures as low as 77° K. or lower, the compressive layer alone may not provide sufficient protection from cracking or other failure caused by such stresses. Alternative solutions are thus needed in the design of such composite structures.

In the improved superconductive composites of the invention, the improvement comprises forming the composite without adhering said superconductive layer to said substrate, with facing surfaces of the substrate and the superconductive layer being in intimate physical contact and thereby allowing efficient heat transfer between the components only when the composite is within the intended operating temperature range.

In one embodiment of the composite, the carbon substrate is a carbon fiber while the superconductive layer forms a sleeve that surrounds the fiber. When the composite is cooled to the operating temperature, the inner surface of the sleeve will be in intimate contact with the outer surface of the carbon fiber. At higher temperatures, e.g. at room temperature, the sleeve will be spaced from the surface of the fiber a distance equal to the thermally expanded inner radius of the sleeve, adjusted for any change in radial size of carbon fiber that may occur. The thickness of the gap between the layers, desirably substantially zero at temperatures within the intended operating temperature range, will thus vary with the temperature of the composite. For a particular temperature outside the operating temperature range, the gap thickness may be determined readily from a consideration of the carbon fiber CTE and the superconductor CTE, together with the superconducting transition temperature.

Turning to the accompanying figures, in FIG. 1 there is shown in cross-section a carbon fiber 10, disposed within a sleeve 15, formed of superconducting ceramic as described. Gap 20, separating the two components, is provided to allow for thermal expansion and contraction of the components. The gap will have substantially zero thickness at the operating temperature, while for other temperatures the thickness of the gap may be determined from a consideration of the intended operating temperature range, which necessarily will be at or below the superconducting transition temperature, the carbon fiber CTE and the CTE of the superconducting ceramic. Generally, the gap will be on the order of from 0.001 to about 0.01 microns for such a structure when the composite is at room temperature. As stated, when cooled to a temperature at or below the superconducting transition temperature for use as a superconductor, gap 20 will decrease, ideally becoming substantially zero thickness at the operating temperature.

Figure 2:
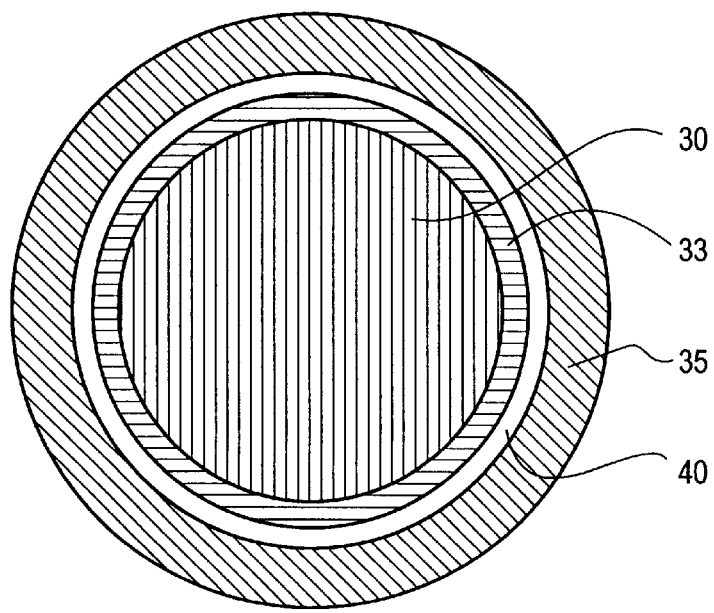
FIG. 2 is a cross-section view of a composite according to the invention having a carbon fiber coated with a compressive layer and disposed within a sleeve layer of ceramic-type superconductor.

As will be readily recognized, in operation there may be minor variations in temperature, and the structure as produced will be less perfect in form than shown in the idealized representation, having irregularities in the surface and thickness of the fiber substrate and the superconducting layer. To accommodate such imperfections and variations, it may be desirable to include a compressive layer sandwiched between the fiber and the superconductive layer. Turning now to FIG. 2, there is shown in cross-section a carbon fiber 30 having coated thereon a compressive layer 33. The coated fiber is disposed within a sleeve 35, formed of a superconducting ceramic material as described The thickness of the gap 40 will be determined to take into account the presence of the compressive layer 33, as well as the thermal characteristics of the material forming the compressive layer, and will be selected as described to be of a dimension such that on reaching the operating temperature the contraction of the superconductive sleeve 35 will place the sleeve in intimate contact with the compressive layer 33, compressing it and thereby affording more uniform and intimate contact.

Although these coating and fiber thermomechanical relationships are characterized herein on the basis of the potential radial stresses that may develop in a cross-sectional plane perpendicular to the central axis of the composite wire, similar relationships will exist in a cross-sectional plane drawn parallel to the axis of the composite wire, where tangential stresses must be accommodated. The precise relationships will be somewhat different in the two planes due to the anisotropic nature of the fiber, but the function of the gap will be the same in either case. High thermal conductivity fibers are very strong in tension, but usually weak in shear strength and in compressive strength. As a consequence of these deficiencies, tangential stresses that develop at the fiber/coating interface due to an inappropriately sized gap will have their primary effect on the fiber, rather than on the coating, which will be able to move longitudinally as the surface of the fiber gives way to the shearing action. This type of stress-relief is not applicable in the plane of the radial stresses, however, and the dimensions of the stress-prevention gap should thus be dictated by the relationships that exist in the plane of the radial stresses.

Some, if not all, of the solid superconductor materials used to make the composite of the instant invention may react with the surface of the carbon fiber at elevated temperatures encountered during fabrication, even when using the preferred pitch fibers with lowered reactivity. Reaction between the components may take place during the laying down of the solid superconductor coating, or during the high temperature annealing (densification) process normally required in converting the superconductor layer into its superconducting form. Such reaction or corrosion can degrade the properties of the superconducting composite to a marked degree. Applying a compressible graphitic layer such as that described above may serve to provide a protective layer as well as to accommodate the differing CTEs of the fiber and the superconductor. It may also be found useful to lay down a thin, electrically conducting coating over the carbon fiber before laying down the superconductor layer, generally after first laying down the compressible layer, if used Such metals as copper, silver (if the annealing temperature is not too high), gold, transition element carbides and nitrides, and the like can be of service and be both conductive and protective. When used, such metallic layers will desirably be quite thin, on the order of tens of Angstroms thick and less than about 1000 Angstroms thick.

A superconductive composite comprising a carbon fiber and a superconductive sleeve according to the invention may conveniently be fabricated by first coating the carbon fiber with a layer of a sacrificial or fugitive material having the appropriate thickness that may be readily removed in a subsequent thermal or thermal-oxidative process step. The coating will then serve as a temporary support when depositing and forming the superconducting ceramic sleeve and, when subsequently removed, will form the desired gap between the fiber and the sleeve. Where the presence of a compressive layer is desired, the carbon fiber may be first coated with the layer of compressive material, followed by application of the temporary support layer.

Generally, any depositable material capable of withstanding the coating conditions and removable without damage to the carbon substrate or superconductive sleeve may be employed in forming the temporary support layer. For example, a layer of pyrolytic carbon may be applied to the fiber, followed by application of the coating of superconducting ceramic. The pyrolytic coating then will be sacrificed by being consumed in an oxidation reaction when the ceramic coating is annealed in an oxidizing atmosphere as is commonly practiced in the art. As will be understood, the oxidation of the pyrolytic carbon layer will require the oxidizing component diffuse inwardly through the ceramic layer, with outward diffusion of the by-product carbon oxides. Extended annealing times may thus be needed to complete the annealing step. In the alternative process the temporary support layer will be formed of a fugitive material capable of being thermally decomposed or vaporized during the annealing operation. As in the thermal oxidative process, the vaporized materials and byproducts will diffuse outwardly through ceramic layer. The fugitive material will thus necessarily be selected to be stable at the temperatures that will be encountered during deposition of the ceramic layer. Where the superconducting layer will be formed of ceramics that require deposition at temperatures above the annealing temperature, removal of the fugitive layer during the annealing step may not be possible, and the thermal oxidative method will then be more preferred.

The superconducting layer may be formed by any of a variety of methods. Desirably, one should make the coating reasonably uniform in thickness over the length of the fiber and, very importantly, continuous over the entire fiber surface. For maximum current density and other beneficial effects, care should be taken that the fiber is either continuously covered or essentially continuously covered. Solid superconductor layer thicknesses of 100 Angstroms or more, more preferably about 5000 to about 50,000 Angstroms thick, are desirable to insure an adequate electrical path for use of the composite as a current carrying device. Too thick a layer of the solid superconductor on the fiber can adversely affect the flexibility of the conductor, and is to be avoided except for those uses where a stiff fiber conductor made from the instant composite can be tolerated. Too thin a layer can adversely affect the current density. Where two dimensional carbon fibers are employed (woven and non-woven fabrics, etc.), flexibility of the composite is not so important Such two dimensional carbon fiber geometries are useful, for example, for making superconducting composites, used for electrical and magnetic shielding, and conducting tubular conductors which are designed to carry the coolant internally.

Deposition techniques for use herein can be quite varied but obviously some are more suitable for complete fiber coverage than others. For example, a simple technique is to solution coat the carbon fiber by making up a solution, aqueous or non-aqueous, containing the proper amounts of compounds of the elements which are to make up the particular superconductor chosen. Alternatively, the superconductor can be prepared by a dry method and then dissolved in an aqueous oxidizing acid solution, for example, nitric acid. Either solution may then be applied to the carbon fiber, used with or without a compressive layer and/or an outer enrobing layer, by running the fiber through the solution. The fiber is then heated, usually in an appropriate atmosphere to produce the superconductor in a thin coating on the fiber by annealing the superconductor layer to achieve the correct stoichiometry, densification and crystal form. Chemical vapor deposition techniques are particularly useful for the purpose of coating the carbon fiber since the fiber, which has a low electrical resistivity, can be electrically heated. Volatile compounds used to make the superconductor can be then decomposed and deposited by contact with the hot carbon fiber. Halides, organometallic compounds and other volatile compounds can be used for this purpose. Electroplating can be also a particularly good method of putting a metal layer down on the fiber.

Other potentially useful deposition techniques embrace the following:
1. sol-gels and soaps
2. sputtering followed by oxidation
3. electron beam evaporation followed by oxidation
4. liquid phase epitaxy
5. laser induced deposition Care should be taken however, that the method chosen is able to completely cover the surface to be coated-a very desirable condition for all the layers described herein. A final adhering metal or alloy coating of the composite is desirable to protect it from decomposition by air, moisture, etc., and also to provide additional electrical and thermal stabilization. It can also serve as a suitable surface to which electrical connections can be made; for example, connection of the composite to a power source. Such conducting materials as gold, silver, copper, aluminum, solder, and the like, can be used for this purpose. Alternatively, the coating can be of material which is able to be coated at the conductor ends with a solderable material. Such coatings should be relatively thin, about a few hundreds up to about a few thousands of Angstroms thick, and are best laid down in a continuous coating by CVD, sputtering, electroplating, etc., as detailed above. Vapor deposition and electroplating methods are preferred.

Low resistivity, pitch-based carbon fiber is not only excellent as a substrate for superconductors because of the high strength, high thermal conductivity, inertness and ultra-high modulus advantages, but also because the fiber lends itself to continuous industrial production. For example, carbon yarn could be payed off a supply spool and into a reactor where electrical contacts on the yarn cause it to be locally heated and where a pyrolytic $C/Al_2O_3$ layer is applied From this first heated zone, the yarn could travel in a continuous fashion through a second chamber where, again, the yarn is heated by its own electrical resistance to a temperature sufficient to expel the aluminum and oxygen and graphitize the low density compressive carbon layer left behind. The yarn could then enter a third chamber where it is similarly heated and coated with the layer of fugitive material, and then with the desired superconductor. As the yarn is moved along, other chambers could be placed in the line to adjust the stoichiometry of the superconducting layer, or to anneal it in order to optimize its superconducting properties. Following chambers could then be used to thermally remove the fugitive layer and to apply an outer coating to the yarn, possibly using electroplating, before it is wound on a spool as a finished product.

Further variations in the composite structure and in the fabrication methods employed to construct the superconducting carbon composite will be readily apparent, and these variations are also contemplated to be within the scope of the invention, the scope of which is defined by the claims appended hereto.

What is claimed is:

1. In a superconducting composite comprising a graphitic, pitch-based carbon fiber having a tensile strength greater than about 350 kpsi tensile strength and a thermal conductivity of at least 900 watts/m/° C., said fiber disposed within a sleeve layer of superconducting mixed oxide having a superconducting transition temperature above 77° K., said mixed oxide of wherein $A_1 B_2 Cu_3 O_{7-x}$, wherein A is one or more elements selected from the group consisting of yttrium, lanthanum and the lanthanides, B is one or more Group IIA elements, and x is a number between 0 and 1, the improvement wherein said sleeve layer of superconducting mixed oxide is a non-adherent sleeve surrounding said fiber.

2. The composite of claim 1, enrobed in a thin adhering outer layer.

3. The composite of claim 1 wherein said carbon fiber is in the form of a continuous fiber.

4. The composite of claim 1 in the form of a fabric or tape.

5. The superconducting composite of claim 1 wherein said fiber is coated with a compressible layer.

* * * * *

UNITED STATES PATENT AND TRADEMARK OFFICE
CERTIFICATE OF CORRECTION

PATENT NO. : 6,187,718 B1
DATED : February 13, 2001
INVENTOR(S) : David A. Schulz It is certified that error appears in the above-identified patent and that said Letters Patent is hereby corrected as shown below:

Column 1,
Line 55, "Addition al aspects" should read -- Additional aspects --

Column 2,
Line 5, "ceramic-type suprconductors" should read -- ceramic-type superconductors --
Line 43, "very severe and raider" should read -- very severe and further --

Column 5,
Line 12, "600°C, the CITE of" should read -- 600°C, the CTE of --
Line 25, "the art During temperature" should read -- the art. During temperature --

Column 6,
Line 25, "as described The thickness" should read -- as described. The thickness --

Column 7,
Line 6, "if used Such metals as" should read -- if used. Such metals as --

Column 8,
Line 67, "applied From this first" should read -- applied. From this first --

UNITED STATES PATENT AND TRADEMARK OFFICE
CERTIFICATE OF CORRECTION

PATENT NO.   : 6,187,718 B1
DATED        : February 13, 2001
INVENTOR(S)  : David A. Schulz It is certified that error appears in the above-identified patent and that said Letters Patent is hereby corrected as shown below:

<u>Column 10,</u>
Line 8, "mixed oxide of wherein" should read -- mixed oxide of formula --
Line 14, "of claim 1, enrobed in" should read -- of claim 1 enrobed in --

Signed and Sealed this

Fifth Day of March, 2002

Attest:

Attesting Officer

JAMES E. ROGAN
Director of the United States Patent and Trademark Office